(12) United States Patent
Park et al.

(10) Patent No.: US 10,103,418 B2
(45) Date of Patent: Oct. 16, 2018

(54) FIRST EM-TUNNEL EMBEDDED IN A FIRST PCB AND FREE SPACE COUPLED TO A SECOND EM-TUNNEL EMBEDDED IN A SECOND PCB

(71) Applicant: Korea Advanced Institute of Science and Technology, Daejeon (KR)

(72) Inventors: Hyo Hoon Park, Daejeon (KR); Hyeon Min Bae, Daejeon (KR); Tae Woo Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 63 days.

(21) Appl. No.: 15/043,288

(22) Filed: Feb. 12, 2016

(65) Prior Publication Data

US 2017/0207510 A1   Jul. 20, 2017

(30) Foreign Application Priority Data

Jan. 18, 2016   (KR) .................. 10-2016-0006066

(51) Int. Cl.
| | |
|---|---|
| H01P 3/12 | (2006.01) |
| H01P 5/107 | (2006.01) |
| H01P 3/16 | (2006.01) |
| H01P 5/02 | (2006.01) |
| H01P 5/08 | (2006.01) |
| H01P 11/00 | (2006.01) |
| H01P 1/04 | (2006.01) |
| H05K 1/02 | (2006.01) |

(52) U.S. Cl.
CPC ............. *H01P 3/122* (2013.01); *H01P 1/042* (2013.01); *H01P 3/165* (2013.01); *H01P 5/02* (2013.01); *H01P 5/087* (2013.01); *H01P 5/107* (2013.01); *H01P 11/001* (2013.01); *H01P 11/006* (2013.01); *H05K 1/0243* (2013.01)

(58) Field of Classification Search
CPC .......... H01P 3/121; H01P 3/122; H01P 5/107
USPC .................................................. 333/239, 26
See application file for complete search history.

(56) References Cited

U.S. PATENT DOCUMENTS

| | | | |
|---|---|---|---|
| 6,724,283 B2* | 4/2004 | Bergstedt et al. ...... | H01P 3/121 333/239 |
| 8,283,764 B2* | 10/2012 | Tang ..................... | H01L 23/041 257/684 |
| 2006/0145778 A1* | 7/2006 | Pleva et al. ............. | H01P 5/107 333/26 |
| 2009/0080832 A1* | 3/2009 | Horine et al. .......... | H01P 3/121 385/14 |
| 2012/0013499 A1* | 1/2012 | Hayata .................... | G01S 7/032 342/112 |
| 2013/0265732 A1* | 10/2013 | Herbsommer et al. ..................... | H05K 1/0243 361/774 |

* cited by examiner

*Primary Examiner* — Benny Lee
(74) *Attorney, Agent, or Firm* — Marshall, Gerstein & Borun LLP (57) ABSTRACT

Disclosed is a printed-circuit board (PCB) structure having an electromagnetic-tunnel-embedded architecture, the PCB structure including a PCB, and an EM-tunnel-embedded in the PCB, wherein the EM-tunnel includes a dielectric core and a metal clad which surrounds the dielectric core and has at least one port exposed to a surface of the PCB.

5 Claims, 10 Drawing Sheets

FIG. 1

(Related Art)

FIG. 2

(Related Art)

FIRST EM-TUNNEL EMBEDDED IN A FIRST PCB AND FREE SPACE COUPLED TO A SECOND EM-TUNNEL EMBEDDED IN A SECOND PCB

CROSS-REFERENCE TO RELATED APPLICATIONS

A claim for priority under 35 U.S.C. § 119 is made to Korean Patent Application No. 10-2016-0006066 filed Jan. 18, 2016, in the Korean Intellectual Property Office, the entire contents of which are hereby incorporated by reference.

BACKGROUND

The following embodiments of the inventive concept relate to a printed-circuit board (PCB) structure having an electromagnetic (EM)-tunnel-embedded architecture which is an electromagnetic waveguide and a method for manufacturing the same, and more particularly to a technology of transmitting electromagnetic signals through an EM-tunnel-embedded in a PCB by embedding an EM-tunnel including at least one horizontal part and at least one vertical part in the PCB.

Substrates suitable for high-capacity/high-speed data processing have been required in high-performance computers or communication systems. Accordingly, the densely-integrated PCB technologies which use a multilayered circuit having a high density of metal connection lines have been developed as substrate technologies for high-capacity/high-speed data processing, but signal loss becomes severe in micro-strip signal lines of metal connection line and an electromagnetic interference between adjacent signal lines increases as data transmission speed increases. In particular, most of signal losses in high-density multilayered connection lines are generated by impedance losses due to impedance mismatching at high frequency, and thus a new measure for basically solving the impedance problem is required.

Figure 1:
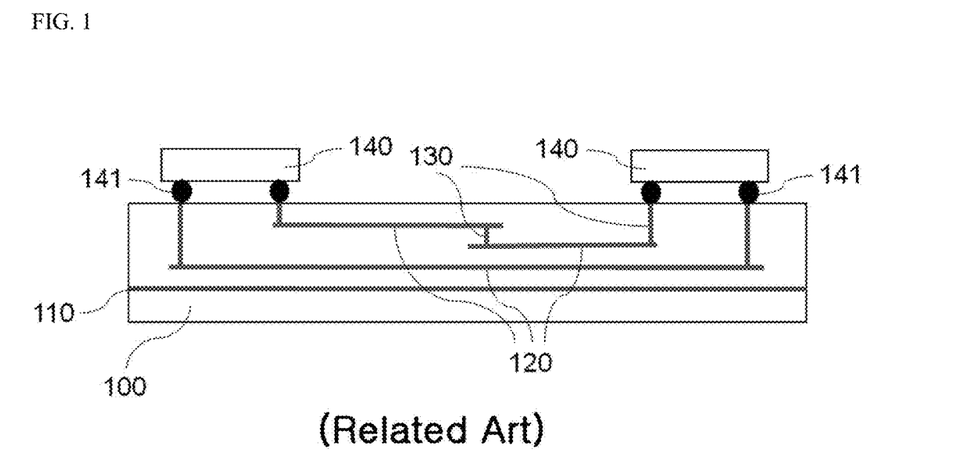
FIG. 1 is a view illustrating the architecture of a densely-integrated printed-circuit board according to the related art.

For example, referring to FIG. 1 illustrating the architecture of a densely-integrated PCB according to the related art, in the densely-integrated PCB 100, micro-strip signal lines 120 corresponding to metal connection lines of high density which are impedance-matched with power supply lines (not illustrated) and a ground layer 110 are disposed horizontally and are responsible for horizontal transmission of signals, and vertical connection lines 130 in which the metal is filled in via-holes are responsible for vertical transmission of signals.

Then, the signals transmitted horizontally and vertically may be transmitted in the form of electrical signals which are transferred through changes in electric voltage or current. Accordingly, electrical signals using electric currents may be transferred to chips 140 mounted on a surface of the densely-integrated PCB 100 through metal wire bonding or metal solder bonding 141.

In the architecture of the densely-integrated PCB according to the related art, the electromagnetic interference (EMI) phenomenon occurs between neighboring signal lines of the micro-strip signal lines 120 and the ground layer 110, causing distortion of signals, and signal lines of another layer may act as capacitances, causing loss of signals. Then, the micro-strip signal lines 120 require impedance-matching to reduce the loss and distortion of signals. However, since the impedance is significantly influenced by the forms, such as the width, thickness, length, shape, material, or the like, of the micro-strip signal lines 120, the architecture of the densely-integrated PCB according to the related art should consider complex parameters in design of the micro-strip signal lines 120 satisfying the impedance matching.

Moreover, the impedance loss cannot be avoided fundamentally in the micro-strip signal lines 120 for high-frequency signals even though the impedance is well matched. Furthermore, for high-frequency signals the impedance matching is particularly difficult to implement in the vertical connection lines 130 through via-holes, so that much impedance loss may be generated.

Meanwhile, recently, an electromagnetic signal transmission technology which uses an electromagnetic wave tube (E-tube) for high speed data transmission through a free space between chips or boards has been suggested (Korean Patent Application No. 10-2015-0029742, PCT Application No. PCT/KR2015/005505). The E-tube is an electromagnetic signal transmission line of a tube type formed with a metal thin film surrounding a dielectric waveguide. The E-tube can be easily bent by using a flexible dielectric material and a metal thin film and thus it provides a function of signal interconnection between a transmission part and a reception part by free bending of the tube in a free space.

Figure 2:
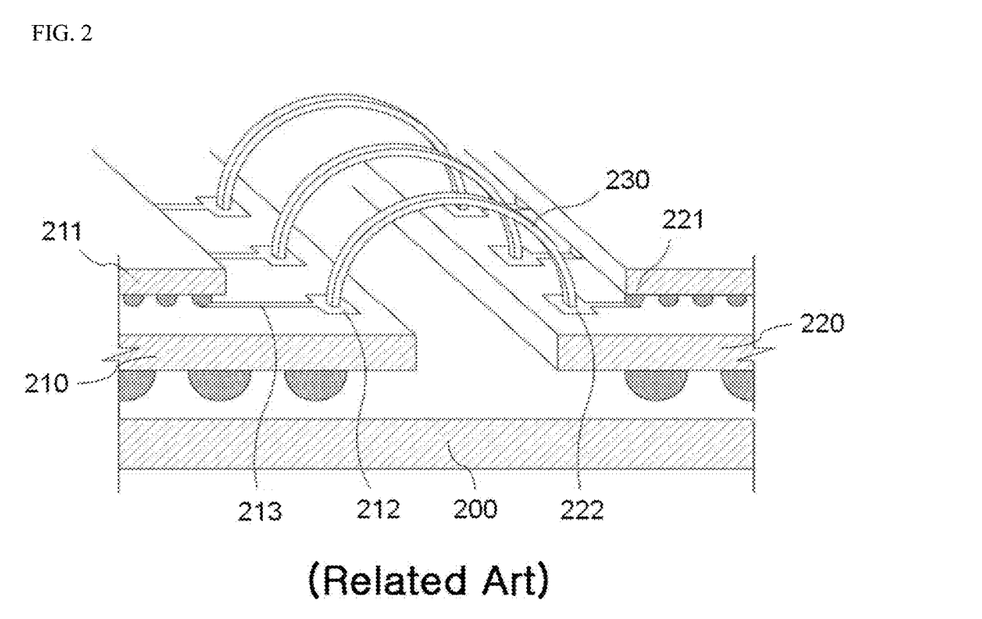
FIG. 2 is a view illustrating an architecture for transmission of electromagnetic signals between chips using an E-tube according to the related art.

For example, referring to FIG. 2 illustrating a structure for transmission of electromagnetic signals between chips using an E-tube according to the related art, a substrate 210 of transmission part and a substrate 220 of reception part are disposed on a PCB 200 and a signal transmitting chip 211 and a signal receiving chip 221 are mounted on the transmission part substrate 210 and the reception part substrate 220, respectively.

Here, E-tubes 230 for transmission of electromagnetic signals are installed between the signal transmitting chip 211 and the signal receiving chip 221, and the E tube 230 is connected just above the micro-strip-to-waveguide transitions (MWTs) 212 and 222 formed on the transmission part substrate 210 and the reception part substrate 220.

The process of transmitting electromagnetic wave signals through the E-tubes 230 is as follows. Electrical signals generated by the signal transmitting chip 211 may be transmitted to the MWT 212 through a micro-strip line 213, and electrical signals transmitted to the MWT 212 may be converted into electromagnetic signals and may be transmitted to the signal receiving side through the E-tube 230. The process of receiving electromagnetic wave signals and converting the electromagnetic wave signals to electrical signals by the signal receiving side may be performed in a reverse sequence of the above-mentioned signal transmitting process.

However, in the case of transmission of electromagnetic signals between chips using the E-tubes 230 according to the related art to apply for a large-capacity system involving interconnection to other PCBs, many E-tubes 230 may be installed on the PCB 200 for interconnection to other PCBs as well as for interconnection between chips on the PCB 200 and thus the E-tubes could be complexly entangled and occupy a large space on the PCB.

Accordingly, to transmit electrical signals into the PCB, instead through a free space, a new architecture of a PCB in which electromagnetic wave transmission lines are appropriately embedded adjusting to the characteristics of the PCB is required.

Accordingly, the following embodiments of the inventive concept suggest a PCB structure having an EM-tunnel-embedded architecture and a technology of manufacturing the same, to solve the disadvantages and problems of the architecture of a densely-integrated PCB and an architecture for transmission of electromagnetic signals between chips using an E-tube according to the related art.

SUMMARY OF THE INVENTION

The inventive concept provides an electromagnetic (EM)-tunnel-embedded printed-circuit board structure which transmits a signal in the form of an electromagnetic wave by replacing a micro-strip signal line which transmits an electrical signal in the form of a voltage or a current in an existing densely-integrated printed-circuit board (PCB), a method for manufacturing the same, and a method of transmitting a signal.

In detail, the inventive concept provides an EM-tunnel-embedded PCB structure including at least one horizontal part and at least one vertical part based on a dielectric core and a metal clad which surrounds the dielectric core, a method for manufacturing the same, and a method of transmitting a signal.

In particular, the inventive concept provides an EM-tunnel-embedded PCB structure in which an electromagnetic signal of a specific frequency band in which absorption of the electromagnetic signal by the metal clad is low enough, a method for manufacturing the same, and a method of transmitting a signal.

Furthermore, the inventive concept provides an EM-tunnel-embedded PCB structure which is compatible with a structure of transmitting electromagnetic signals between chips by using an existing E-tube, a method for manufacturing the same, and a method of transmitting a signal.

One aspect of embodiments of the inventive concept is directed to provide a PCB structure having an EM-tunnel-embedded architecture, wherein the EM-tunnel includes a dielectric core and a metal clad which surrounds the dielectric core and has at least one port exposed to a surface of the PCB.

The EM-tunnel may transmit an electromagnetic signal of a specific frequency band in which absorption of the electromagnetic signal by the metal clad is low enough.

The EM-tunnel may include at least one horizontal part and at least one vertical part, and a connecting part which connects the at least one horizontal part and the at least one vertical part may have at least one of a perpendicular form, an oblique form, or a curved form.

The at least one port of the EM-tunnel may be connected to a micro-strip-to-waveguide transition mounted on a surface of the PCB to transfer an electromagnetic signal from the MWT to the EM-tunnel.

The at least one port of the EM-tunnel may transmit an electromagnetic signal to another EM-tunnel-embedded in another PCB separated from the PCB through an E-tube which connects the at least one port of the EM-tunnel and at least one port of the other EM-tunnel.

Connectors may be disposed to couple between the at least one port of the EM-tunnel and the at least one port of the E-tube, and the cross-section of an aperture on one side of the connector may have a shape which coincides with the cross-sectional shape of the EM-tunnel, and the cross-section of an aperture on another side of the connector coincides with the cross-sectional shape of the E-tube.

The at least one port of the EM-tunnel may be disposed to face the at least one port of the other EM-tunnel-embedded in the other PCB separated from the PCB to transmit an electromagnetic signal to the other EM-tunnel through a free space between the PCB and the other PCB.

Connectors may be disposed to couple between the at least one port of the EM-tunnel and the at least one port of the other EM-tunnel, and the cross-section of an aperture on one side of the connector may have a shape which coincides with the cross-sectional shape of the EM-tunnel or the other EM-tunnel, and the cross-section of an aperture on another side of the connector has a funnel shape for emitting and receiving the electromagnetic signal through the free space.

Another aspect of embodiments of the inventive concept is directed to provide a method for manufacturing a PCB structure having an EM-tunnel-embedded architecture, the method including: laminating a horizontal metal thin film and a horizontal dielectric material on a PCB such that an EM-tunnel including a dielectric core and a metal clad which surrounds the dielectric core is embedded in the PCB to form at least one horizontal part of the EM-tunnel, and forming a via hole in the PCB and laminating a vertical metal thin film and a vertical dielectric material to form at least one vertical part of the EM-tunnel, wherein the at least one port of the EM-tunnel is exposed to a surface of the PCB.

Still another aspect of embodiments of the inventive concept is directed to provide a method for manufacturing a PCB structure having an EM-tunnel-embedded architecture, the method including: laminating a horizontal metal thin film and a horizontal dielectric material on a PCB such that an EM-tunnel including a dielectric core and a metal clad which surrounds the dielectric core is embedded in the PCB to form at least one horizontal part of the EM-tunnel, forming a groove into which an EM-tunnel connecting block including at least one vertical part of the EM-tunnel, and a connecting part which connects at least one horizontal part of the EM-tunnel and the at least one vertical part of the EM-tunnel is inserted, and inserting the EM-tunnel connecting block into the groove formed in the PCB, wherein the at least one port of the EM-tunnel is exposed to a surface of the PCB.

Yet another aspect of embodiments of the inventive concept is directed to provide a method for manufacturing a PCB structure having an EM-tunnel-embedded architecture, the method including: forming a groove into which an EM-tunnel unit including at least one horizontal part of the EM-tunnel and at least one vertical part of the EM-tunnel is inserted such that an EM-tunnel including a dielectric core and a metal clad which surrounds the dielectric core is embedded in the PCB, and inserting the EM-tunnel unit into the groove formed in the PCB, wherein the at least one port of the EM-tunnel is exposed to a surface of the PCB.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION OF THE INVENTION

Hereinafter, exemplary embodiments of the inventive concept will be described in detail with reference to the accompanying drawings. However, the inventive concept is neither limited nor restricted by the embodiments. Further, the same reference numerals in the drawings denote the same members.

Furthermore, the terminologies used herein are used to properly express the embodiments of the inventive concept, and may be changed according to the intentions of the user or the manager, or according to the custom in the field to which the inventive concept pertains. Therefore, definition of the terms should be made according to the overall disclosure set forth herein.

Figure 3A:
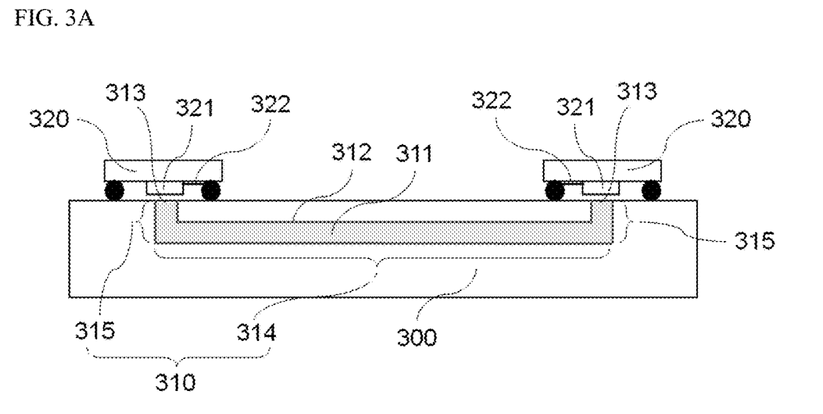
FIGS. 3A to 3C are views illustrating the architecture of a printed-circuit board according to an embodiment of the inventive concept.
Figure 3B:
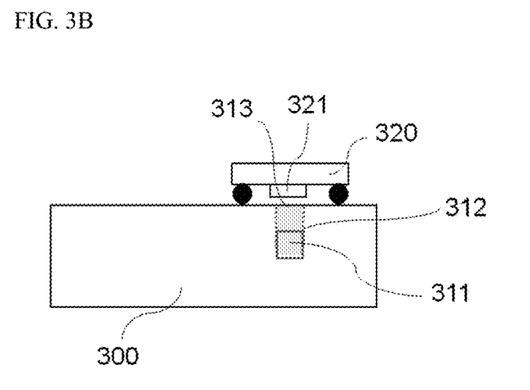
Figure 3C:
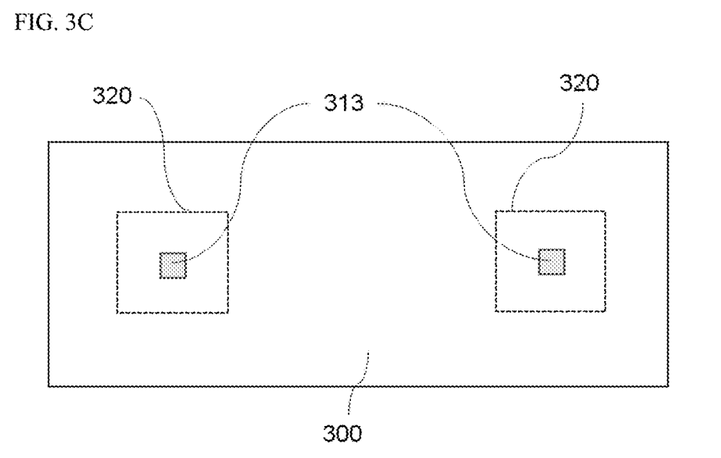

FIGS. 3A to 3C are views illustrating the architecture of a printed-circuit board (PCB) according to an embodiment of the inventive concept. In detail, FIG. 3A is a view illustrating a longitudinal sectional view of a PCB according to an embodiment of the inventive concept, FIG. 3B is a view illustrating a transverse sectional view of the PCB according to the embodiment of the inventive concept, and FIG. 3C is a view illustrating a top surface of the PCB according to the embodiment of the inventive concept.

Referring to FIGS. 3A to 3C, an electromagnetic (EM)-tunnel 310 (see FIG. 3A) is embedded in the PCB 300 according to the embodiment of the inventive concept. Here, the EM-tunnel 310 includes a dielectric core 311 and a metal clad 312 (see FIGS. 3A and 3B) which surrounds the dielectric core 311, and has at least one port 313 exposed to a surface of the PCB 300.

For example, the dielectric core 311 may be formed of any one of a dielectric material or air, and the metal clad 312 may be formed of a metal thin film to surround the dielectric core 311. Hereinafter, because air is also a dielectric material in a broad meaning, it will be described that the dielectric core 311 includes a core of an empty space. That is, a rectangular peripheral portion of the cross-section of the EM-tunnel may correspond to the metal clad 312, and the inner space thereof may correspond to the dielectric core 311.

In particular, the EM-tunnel 310 may transmit an electromagnetic signal of a specific frequency band in which absorption of the electromagnetic signal by the metal clad 312 is low enough. As compared with an optical fiber according to the related art, because an optical fiber employs dielectric materials for both the core and the clad, it is used to transmit an electromagnetic signal of a frequency band corresponding to a near-infrared light, usually. However, because an electromagnetic signal of a near-infrared frequency band is severely absorbed by the metal clad when the clad is formed of the metal material, the frequency band of the near-infrared light according to the related art to the optical fiber is not suitable for the EM-tunnel 310 according to the embodiment of the inventive concept.

That is, because the EM-tunnel 310 embedded in the PCB 300 according to the embodiment of the inventive concept includes a dielectric core 311 and a metal clad 312 which surrounds the dielectric core 311, only an electromagnetic signal of a frequency band which is reflected without being severely absorbed by the metal clad 312 may be transmitted to the EM-tunnel 310. Because the thickness of the PCB 300 is usually within several millimeters, the height of the dielectric core 311 of the EM-tunnel 310 is restricted to several millimeters or less. Because the wavelength of the electromagnetic wave which is close to the size of the dielectric core 311 of the EM-tunnel 310 is suitable for isolating the electromagnetic wave within the dielectric core 311, the electromagnetic wave to transmit inside the PCB 300 preferably should have a wavelength scale of several millimeters or less. Within this wavelength scale considering the waveguide loss according to the wavelength (or frequency) of the electromagnetic wave in the metal clad 312 which surrounds the dielectric core 311, the wavelength band thereof is preferably several millimeters or several hundreds of micrometers. In such ways, in consideration of the waveguide loss characteristics of the metal clad 312 and the restriction by the thickness of the PCB 300, the frequency band which is suitably transmitted to the EM-tunnel 310 embedded in the PCB 300 according to the embodiment of the inventive concept may be several tens of gigahertz to several terahertz as described above. For example, the electromagnetic signals of frequency bands of several tens of gigahertz to several terahertz may include an RF wave, a millimeter wave, and a terahertz wave. In consideration of the waveguide loss and the geometry of the PCB 300, not only a suitable frequency may be selected but also the detailed shape and dimension (the width and height of the transverse cross-section of the dielectric core 311, the length of a tunnel, an embedding depth, and the like) of the EM-tunnel 310 may be determined.

Hereinabove, it is preferable that the EM-tunnel 310 is formed to have an inner space isolated in the PCB (to have the dielectric core 311 sealed from the outside by the metal clad 312) so that an electromagnetic signal which proceeds into the EM-tunnel 310 is not leaked to the outside of the EM-tunnel 310.

In particular, because the EM-tunnel 310 includes at least one horizontal part 314 and at least one vertical part 315, it may be sealed by the metal clad 312 such that an electromagnetic signal is not leaked from a connecting part which connects the least one horizontal part 314 and the at least one vertical part 315.

Here, the cross-section of the EM-tunnel 310 may have a rectangular shape. However, the inventive concept is neither limited nor restricted thereto, but the cross-section of the EM-tunnel 310 may have any one of a triangular shape, a polygonal shape, and a circular shape. A detailed description thereof will be made with reference to FIGS. 4A to 4C.

Then, the connecting part which connects the at least one horizontal part 314 and the at least one vertical part 315 (see FIG. 3A) of the EM-tunnel 310 may have a perpendicular form. However, the inventive concept is neither limited nor restricted thereto, but the connecting part which connects the at least one horizontal part 314 and the at least one vertical part 315 may have any one of an oblique form (for example, a form inclined at 45 degrees) or a curved form. A detailed description thereof will be also made with reference to FIGS. 4A to 4C.

Because the at least one port (aperture) 313 of the EM-tunnel 310 is formed to be exposed to a surface of the PCB 300, an electromagnetic signal may be input or output through the at least one port 313 of the EM-tunnel 310. Here, a chip 320 is mounted on a surface of the PCB 300 to transmit an electromagnetic signal to the EM-tunnel 310 or receive an electromagnetic signal output from the EM-tunnel 310.

For example, the at least one port 313 of the EM-tunnel 310 is aligned with an MWT 321 (see FIGS. 3A and 3B) formed on the bottom surface of the chip 320 mounted on the surface of the PCB 300 to make contact with the MWT 321. And then the at least one port 313 may admit the electromagnetic signal emitted from the MWT 321 into the EM-tunnel 310 and output the electromagnetic signal passed through the EM-tunnel 310 toward the MWT 321.

Hereinabove, the MWT 321 formed on the chip 320 may be disposed at an end of a micro-strip transmission line 322 (see FIG. 3A) similarly to the related art. However, in the PCB 300 according to the embodiment of the inventive concept, the MWT 321 may be placed closely approaching the at least one port 313 of the EM-tunnel 310.

Although it is illustrated in the drawings that the at least one port 313 of the EM-tunnel 310 is situated at a distal end of the at least one vertical part 315 of the EM-tunnel 310, the inventive concept is neither limited nor restricted but the at least one port 313 of the EM-tunnel 310 may be situated at a distal end of the at least one horizontal part 314 of the EM-tunnel 310. In this case, the at least one port 313 may be exposed to a side surface of the PCB 300.

Figure 4A:
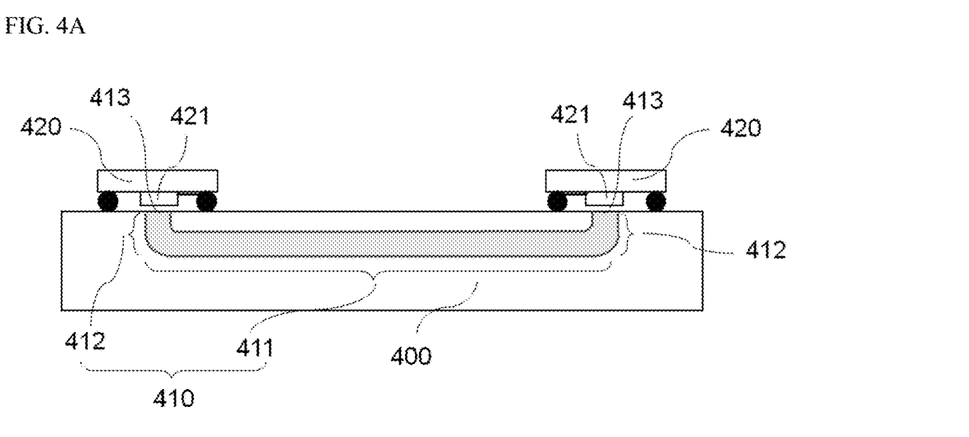
FIGS. 4A to 4C are views illustrating the architecture of a printed-circuit board according to another embodiment of the inventive concept.
Figure 4B:
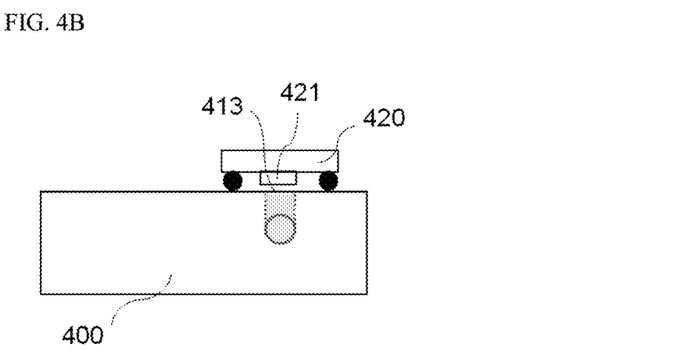
Figure 4C:
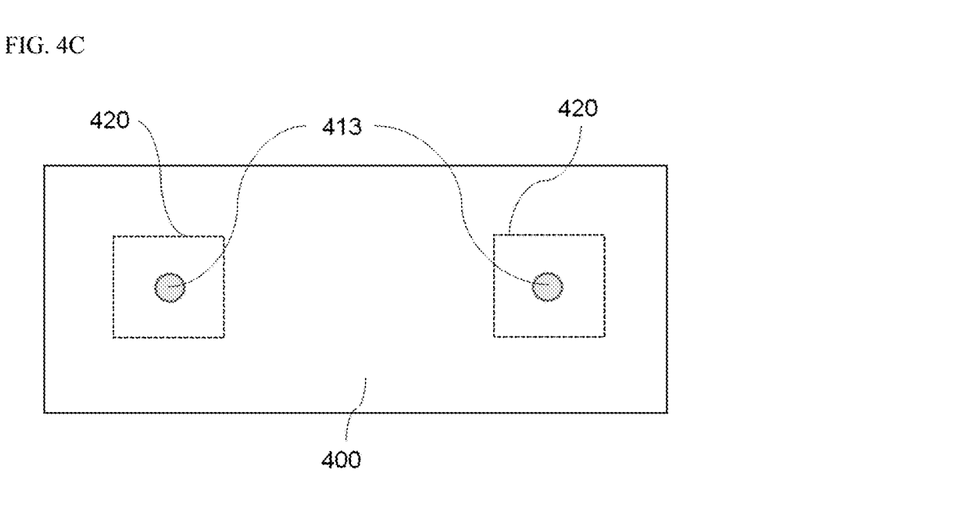

FIGS. 4A to 4C are views illustrating the architecture of a PCB according to another embodiment of the inventive concept. In detail, FIG. 4A is a view illustrating a longitudinal sectional view of a PCB according to another embodiment of the inventive concept, FIG. 4B is a view illustrating a transverse sectional view of the PCB according to the embodiment of the inventive concept, and FIG. 4C is a view illustrating a top surface of the PCB according to the embodiment of the inventive concept.

Referring to FIGS. 4A to 4C, the transverse section of the EM-tunnel 410 (see FIG. 4A) according to the embodiment of the inventive concept may have a circular shape. Then, the connecting part which connects the at least one horizontal part 411 and the at least one vertical part 412 (see FIG. 4A) of the EM-tunnel 410 may have a curved form on the longitudinal section. However, the inventive concept is neither limited nor restricted thereto, but the form of the connecting part which connects the at least one horizontal part 411 and the at least one vertical part 412 of the EM-tunnel 410 may be determined in various forms considering of the section of the EM-tunnel 410. Hereinafter, the circular shape means a round shape including both a circle and an ellipse, and the curved shape means a form which is smoothly curved so as not to include an angulated corner. Accordingly, by the connecting part having a curved form which connects the at least one horizontal part 411 and the at least one vertical part 412, the EM tunnel 410 according to the embodiment of the inventive concept can prevent scattering of the electromagnetic wave at the connecting part and minimize waveguide loss. Similarly, the connecting part which connects the at least one horizontal part 411 and the at least one vertical part 412 may have an oblique form to prevent scattering of the electromagnetic wave and minimize waveguide loss.

In the embodiment of FIGS. 4A to 4C, disposition of the at least one port 413 of the EM-tunnel on the PCB 400 in which the EM-tunnel 410 having a circular shape is embedded, installation of the MWT 421 (see FIGS. 4A and 4B), and mounting of the chip 420 may be applied in the same way as described with reference to FIGS. 3A to 3C. Further, in the embodiment of the inventive concept, a method of inputting and outputting an electromagnetic signal through the EM-tunnel 410 in the chip 420 may also be applied in the same way as described with reference to FIGS. 3A to 3C.

In this way, one EM-tunnel or a plurality of EM-tunnels may be embedded in the PCBs illustrated in FIGS. 3A to 3C and 4A to 4C. In this case, the plurality of EM-tunnels may be disposed in an array form, and may have different sectional shapes and different connecting parts (connecting parts which connect at least one horizontal part and at least one vertical part).

Figure 5A:
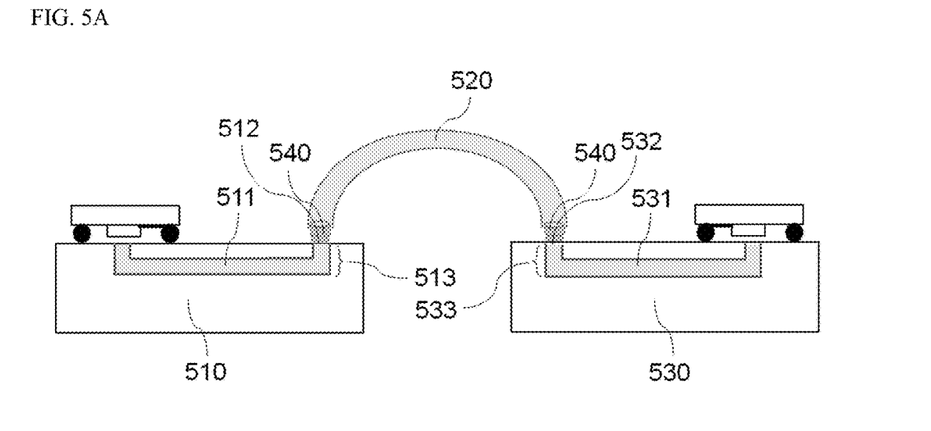
FIGS. 5A to 5E are views illustrating a connecting structure between printed-circuit boards according to an embodiment of the inventive concept.
Figure 5B:
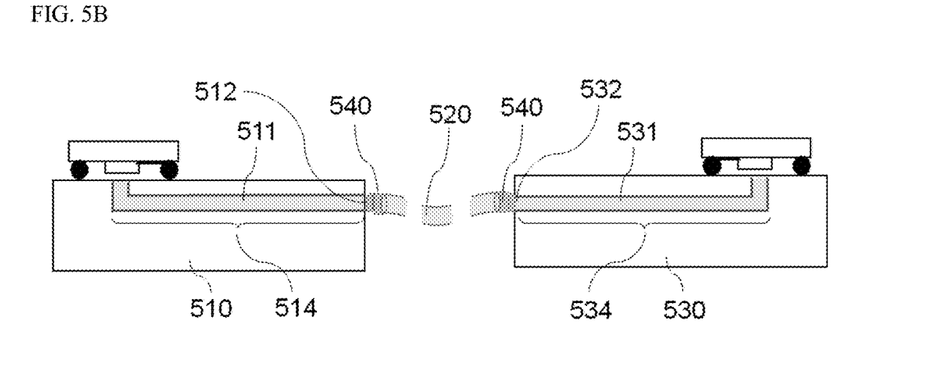
Figure 5C:
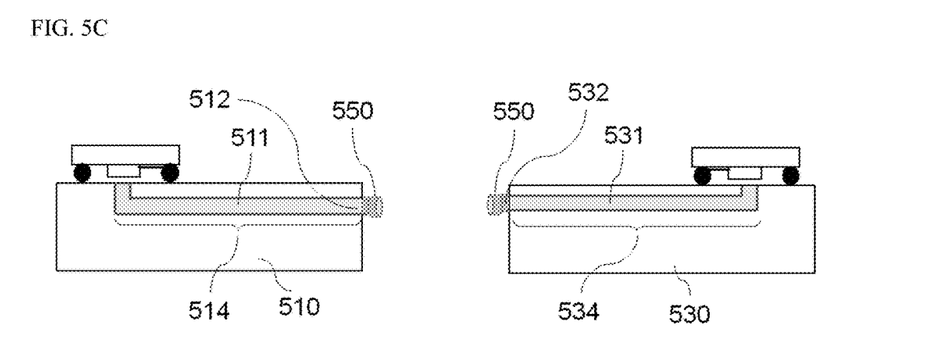
Figure 5D:
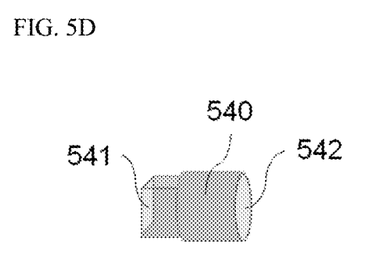
Figure 5E:
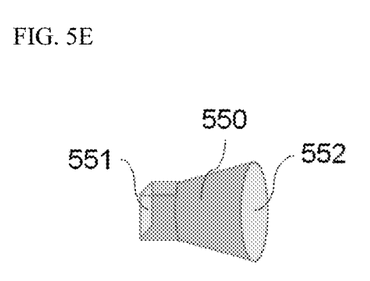

FIGS. 5A to 5E are views illustrating a connecting structure between PCBs according to an embodiment of the inventive concept. In detail, FIG. 5A is a view illustrating a structure in which EM-tunnel-embedded PCBs according to the embodiment of the inventive concept are connected to each other by an E-tube which makes contact with the upper surfaces of the PCBs, FIG. 5B is a view illustrating a structure in which EM-tunnel-embedded PCBs according to the embodiment of the inventive concept are connected to each other by an E-tube which makes contact with the side surfaces of the PCBs, FIG. 5C is a view illustrating a structure in which EM-tunnel-embedded PCBs according to the embodiment of the inventive concept are connected to at least one port by a free space. FIG. 5D is a view illustrating a connector provided in the PCBs of FIGS. 5A and 5B, and FIG. 5E is a view illustrating a connector provided in the PCB of FIG. 5C. Hereinafter, it will be described that the section of the EM-tunnel illustrated in FIGS. 5A to 5C has a rectangular shape and the connecting part which connects at least one horizontal part and at least one vertical part of the EM-tunnel has a perpendicular form.

Referring to FIG. 5A, the EM-tunnel 511 in which the PCB 510 according to the embodiment of the inventive concept is embedded may be connected to another EM-tunnel 531 by connecting the at least one port 512 of the EM-tunnel 511 through an E-tube 520 to at least one port 532 of another EM-tunnel 531 in which another PCB 530 is embedded. Accordingly, the at least one port 512 of the EM-tunnel 511 may transmit an electromagnetic signal to another EM-tunnel 531 through the E-tube 520.

Hereinabove, the at least one port 512 of the EM-tunnel 511 and the at least one port 532 of the EM-tunnel 531 may be formed to be exposed to the upper surfaces of the PCB 510 and the PCB 530, respectively. For example, the at least one port 512 of the EM-tunnel 511 may be disposed at a distal end of the at least one vertical part 513 of the EM-tunnel 511 to be exposed to the upper surface of the PCB 510, and the at least one port 532 of the EM-tunnel 531 may be disposed at a distal end of the at least one vertical part 533 of the EM-tunnel 531 to be exposed to the upper surface of the PCB 530.

Referring to FIG. 5B, the at least one port 512 of the EM-tunnel 511 embedded in the PCB 510 according to the embodiment of the inventive concept and the at least one port 532 of the EM-tunnel 531 embedded in the PCB 530 may be formed to be exposed to the side surfaces of the PCB 510 and the PCB 530, respectively.

For example, the at least one port 512 of the EM-tunnel 511 may be disposed at a distal end of the at least one horizontal part 514 of the EM-tunnel 511 to be exposed to the side surface of the PCB 510, and the at least one port 532 of the EM-tunnel 531 may be disposed at a distal end of the at least one horizontal part 534 of the EM-tunnel 531 to be exposed to the side surface of the PCB 530.

Accordingly, the at least one port 512 of the EM-tunnel 511 exposed to the side surface of the PCB 510 may transmit an electromagnetic signal to another EM-tunnel 531 through the E-tube 520.

Referring to FIG. 5C, the at least one port 512 of the EM-tunnel 511 embedded in the PCB 510 according to the embodiment of the inventive concept and the at least one port 532 of the EM-tunnel 531 embedded in the PCB 530 may be formed to be exposed to the side surfaces of the PCB 510 and the PCB 530, respectively.

For example, the at least one port 512 of the EM-tunnel 511 may be disposed at a distal end of the at least one horizontal part 514 of the EM-tunnel 511 to be exposed to the side surface of the PCB 510, and the at least one port 532 of the EM-tunnel 531 may be disposed at a distal end of the at least one horizontal part 534 of the EM-tunnel 531 to be exposed to the side surface of the PCB 530.

Accordingly, the at least one port 512 of the EM-tunnel 511 may transmit an electromagnetic signal to another EM-tunnel 531 through a free space between the PCB 510 and the PCB 530.

Hereinabove, the at least one port 512 of the EM-tunnel 511 is disposed to face the at least one port 532 of the EM-tunnel 531 so that an electromagnetic signal is transmitted through a free space more simply.

As illustrated in FIGS. 5A and 5B, for the EM-tunnel 511 to be effectively coupled to another EM-tunnel 531 through the E-tube 520, connectors 540 may be disposed in the at least one port 512 of the EM-tunnel 511 and the at least one port 532 of the EM-tunnel 531, respectively. Then, as illustrated in FIG. 5D, the section of an aperture 541 on one side of the connector 540 may be formed to have the same shape as the sectional shape (for example, a rectangular shape) of the EM-tunnel 531 (see FIGS. 5A to 5C), and the section of an aperture 542 on another side of the connector 540 may be formed to have the same shape as the sectional shape (for example, a circular shape) of the E-tube 520 (see FIG. 5A).

However, the inventive concept is neither limited nor restricted thereto, but the section of the aperture 541 on one side of the connector 540 and the section of the aperture 542 on the other side of the connector 540 may be adaptively formed according to the sectional shapes of the EM-tunnels 511 and 531 and the sectional shape of the E-tube 520.

As illustrated in FIG. 5C, for the EM-tunnel 511 to effectively transmit an electromagnetic signal to another EM-tunnel 531 through a free space, connectors 550 may be disposed in the at least one port 512 of the EM-tunnel 511 and the at least one port 532 of the EM-tunnel 531, respectively. Then, as illustrated in FIG. 5E, the section of an aperture 550 on one side of the connector 551 may be formed to have the same shape as the sectional shape (for example, a rectangular shape) of the EM-tunnel 531, and the section of an aperture 550 on another side of the connector 552 may be formed to have a funnel shape for transmitting and receiving an electromagnetic signal through a free space.

However, the inventive concept is neither limited nor restricted thereto, but the section of the aperture 551 on one side of the connector 550 may be adaptively formed according to the sectional shapes of the EM-tunnels 511 and 531 to which the connector 550 is connected, and the section of the aperture 552 on the other side of the connector 550 may have various shapes suitable for radiating and intaking an electromagnetic signal.

Further, aperture shapes of the connectors 540 and 550 may be modified for easy attaching and detaching with the EM-tunnels 511 and 531 or the E-tube 520.

Figure 6A:
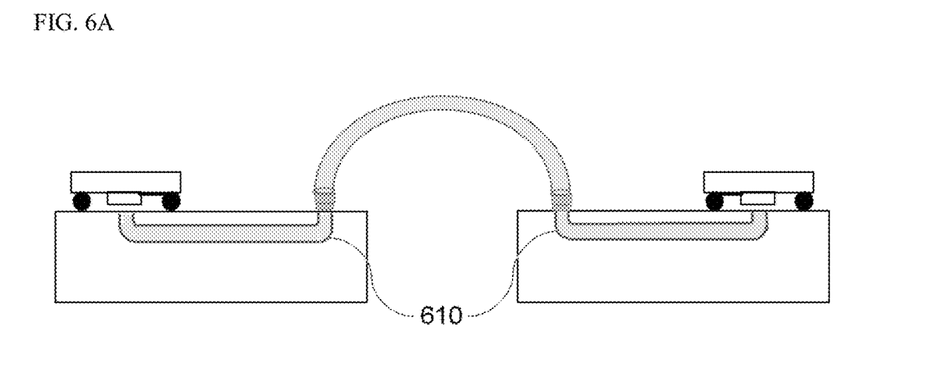
FIGS. 6A to 6E are views illustrating a connecting structure between printed-circuit boards according to another embodiment of the inventive concept.
Figure 6B:
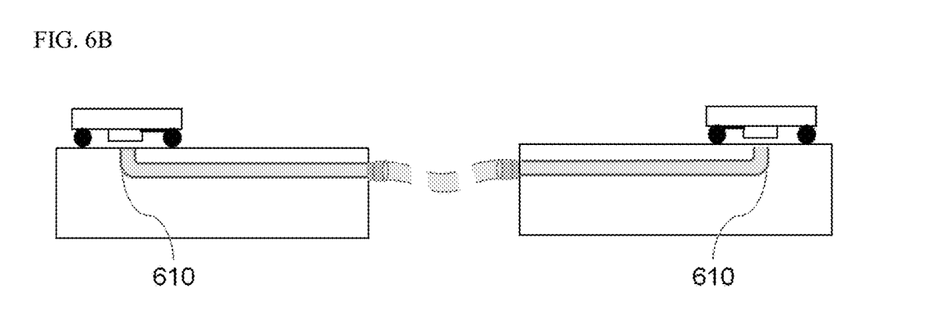
Figure 6C:
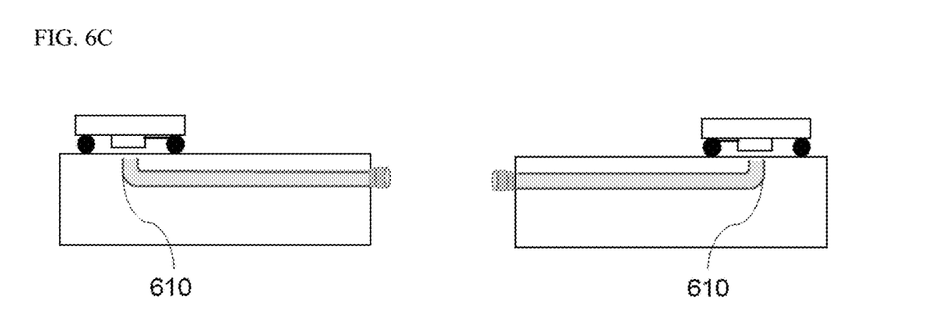
Figure 6D:
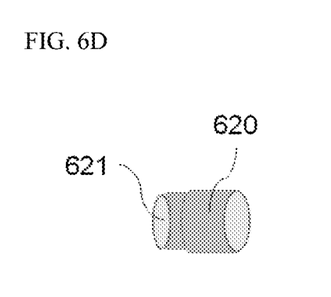
Figure 6E:
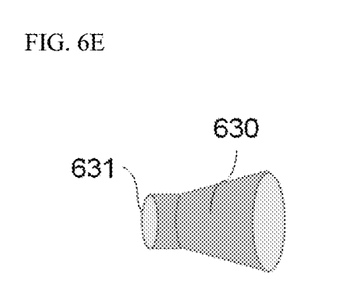

FIGS. 6A to 6E are views illustrating a connecting structure between PCBs according to another embodiment of the inventive concept. In detail, FIG. 6A is a view illustrating a structure in which EM-tunnel-embedded PCBs according to the embodiment of the inventive concept are connected to each other by an E-tube which makes contact with the upper surfaces of the PCBs, FIG. 6B is a view illustrating a structure in which EM-tunnel-embedded PCBs according to the embodiment of the inventive concept are connected to each other by an E-tube which makes contact with the side surfaces of the PCBs, FIG. 6C is a view illustrating a structure in which EM-tunnel-embedded PCBs according to the embodiment of the inventive concept are connected to at least one port through a free space, FIG. 6D is a view illustrating a connector provided in the PCB of FIGS. 6A and 6B, and FIG. 6E is a view illustrating a connector provided in the PCB of FIG. 6C.

The connecting structure between the PCBs according to the embodiment illustrated with reference to FIGS. 6A to 6E is the same as illustrated in FIGS. 5A to 5E, but is different from the connecting structure of FIGS. 5A to 5E in that the connecting part 610 (see FIGS. 6A to 6C) which connects the at least one horizontal part and the at least one vertical part of the EM-tunnel has a curved form.

Accordingly, the connectors 620 and 630 illustrated in FIGS. 6D and 6E, respectively, may be formed to have a circular shape in which the sectional shapes of the apertures 621 (see FIG. 6D) and 631 (see FIG. 6E) on the sides of the corresponding connectors 620 and 630 are the same as the sectional shapes of the EM-tunnels to which the connectors 620 and 630 are connected.

FIGS. 7A to 7D are views illustrating a method for manufacturing a PCB according to an embodiment of the inventive concept. In detail, FIGS. 7A to 7D are views illustrating a method for manufacturing an EM-tunnel-embedded PCB (for example, the PCB illustrated in FIGS. 3A to 3C) in which a connecting part which connects at least one horizontal part and at least one vertical part has a linear form and the section of the EM-tunnel has a rectangular shape. However, the inventive concept is neither limited nor restricted thereto, but the above-mentioned method may be used to manufacture an EM-tunnel-embedded PCB in which a connecting part has various forms and various sectional forms.

Figure 7A:
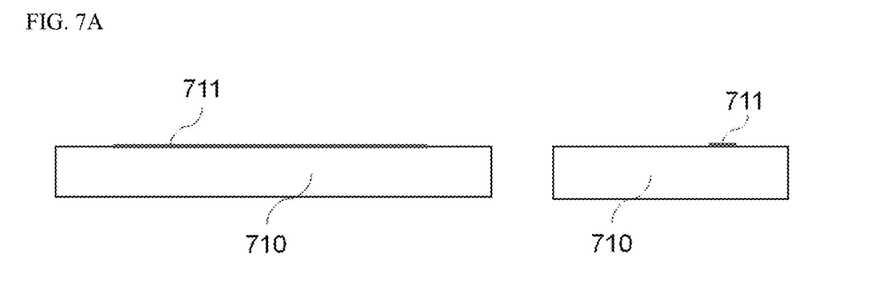
FIGS. 7A to 7D are views illustrating a method for manufacturing a printed-circuit board according to an embodiment of the inventive concept.
Figure 7B:
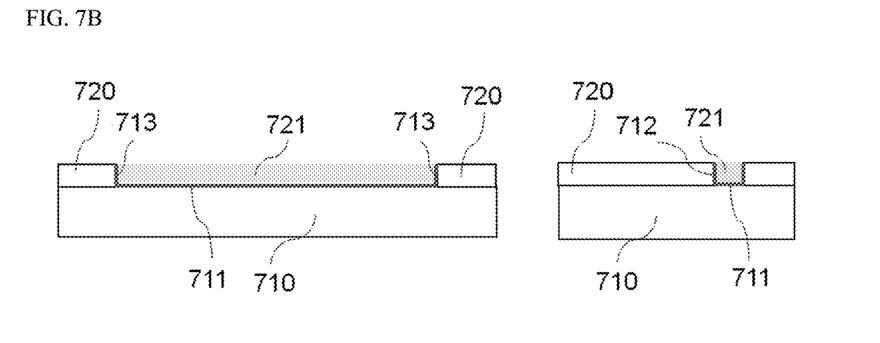
Figure 7C:
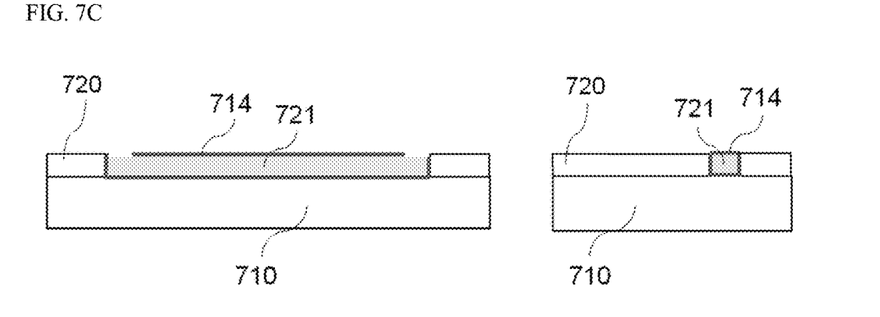
Figure 7D:
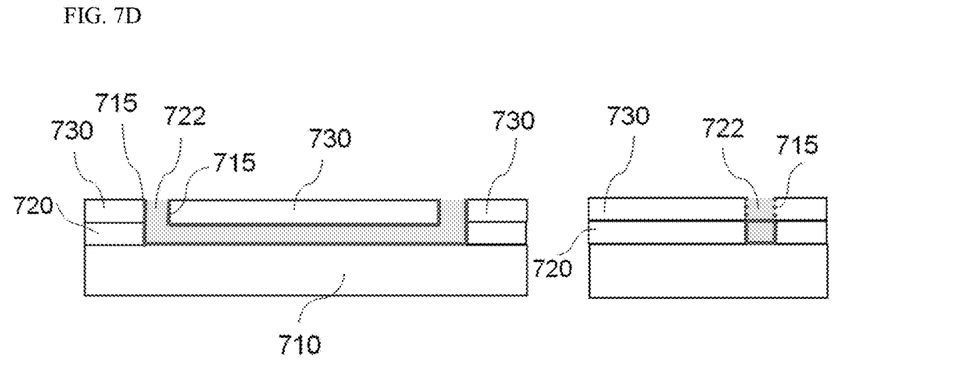

FIGS. 7A to 7C are views illustrating steps of forming at least one horizontal part of an EM-tunnel, and FIG. 7D is a view illustrating a step of forming at least one vertical part of the EM-tunnel.

Referring to FIGS. 7A to 7C, a system for manufacturing a PCB according to an embodiment of the inventive concept (hereinafter, referred to as the system), at least one horizontal part of the EM-tunnel is formed by laminating a horizontal metal thin film and a horizontal dielectric material on the PCB such that the EM-tunnel including a dielectric core and a metal clad which surrounds the dielectric core is embedded in the PCB.

In detail, the system may form a lower horizontal metal thin film 711 (see FIGS. 7A and 7B) that will form a lower surface of the metal clad included in the at least one horizontal part of the EM-tunnel, on a first PCB 710.

Thereafter, as shown in FIG. 7B, the system may laminate a second PCB 720 on the first PCB 710 and may laminate a horizontal dielectric material 721 on an upper recess of the lower horizontal metal thin film 711 as a dielectric core. Further, the system may form a side horizontal metal thin film 712 which will form a side surface of the metal clad provided at the at least one horizontal part of the EM-tunnel on a side surface of the at least one horizontal part of the EM-tunnel. The system may also form metal thin films 713 which will form the metal clad provided at a connecting part of the EM-tunnel at opposite ends of the at least one horizontal part of the EM-tunnel.

Next, as shown in FIG. 7C, the system may form an upper horizontal metal thin film 714 that will form an upper surface of the metal clad included in the at least one horizontal part of the EM-tunnel, on the horizontal dielectric material 721.

Referring to FIG. 7D, thereafter, the system may form via holes in the PCBs 710, 720, and 730, and may form at least one vertical part of the EM-tunnel by laminating a vertical metal thin film and a vertical dielectric material.

For example, the system may form a vertical via hole by laminating a third PCB 730, and may laminate a vertical dielectric material 722 as a dielectric core included at the at least one vertical part of the EM-tunnel. Further, the system may form a vertical metal thin film 715 as the metal clad included at the at least one vertical part of the EM-tunnel.

Accordingly, the at least one port of the EM-tunnel manufactured through the above-mentioned manufacturing process may be exposed to a surface of the PCB.

Here, the system may use a dielectric material as the dielectric core, or may use an empty space as the dielectric core as well.

Then, the process of forming a metal clad included at the at least one horizontal part of the EM-tunnel may be performed by applying general manufacturing processes of the metal thin films being used in common PCBs, and the process of forming a metal clad included at the at least one vertical part of the EM-tunnel may be performed by applying general manufacturing processes of via holes and filling the via holes with a metal.

However, the inventive concept is neither limited nor restricted, but the PCB according to the embodiment of the inventive concept may be manufactured through various processes such that the EM-tunnel including a dielectric core and a metal clad which surrounds the dielectric core.

Figure 8A:
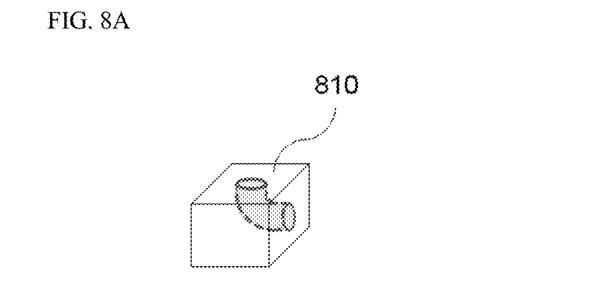
FIGS. 8A to 8C are views illustrating a method for manufacturing a printed-circuit board according to another embodiment of the inventive concept.
Figure 8B:
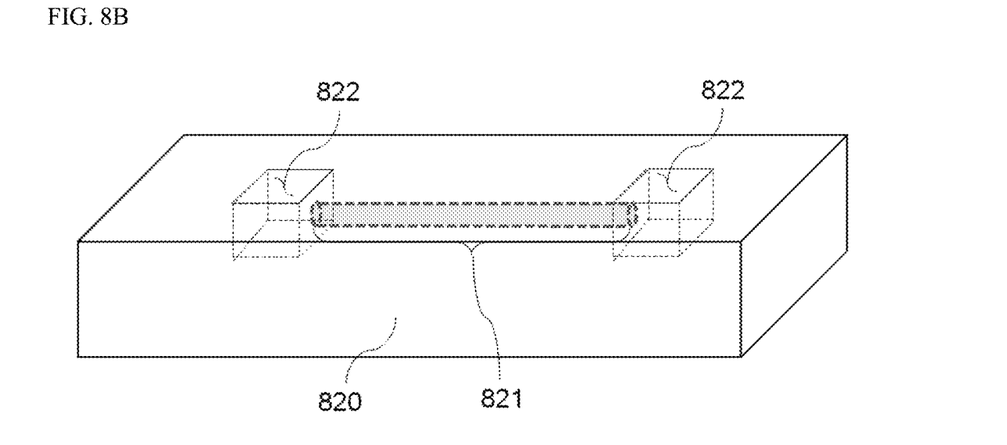
Figure 8C:
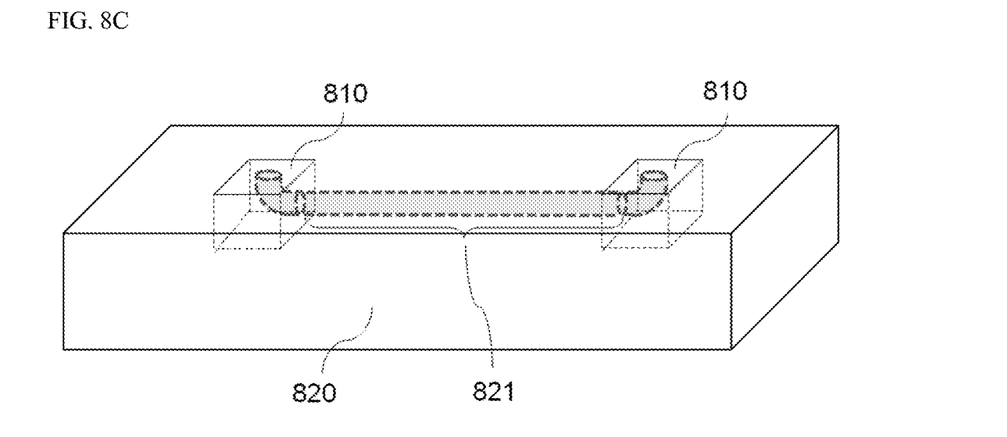

FIGS. 8A to 8C are views illustrating a method for manufacturing a PCB according to another embodiment of the inventive concept. In detail, FIGS. 8A to 8D are views illustrating a method for manufacturing an EM-tunnel-embedded PCB (for example, the PCB illustrated in FIGS. 4A to 4C) in which a connecting part which connects at least one horizontal part and at least one vertical part has a curved form and the section of the EM-tunnel has a circular shape. However, the inventive concept is neither limited nor restricted thereto, but the above-mentioned method may be used to manufacture an EM-tunnel-embedded PCB in which a connecting part has various forms and various sectional forms.

FIG. 8A is a view illustrating a step of preparing an EM-tunnel connecting block, FIG. 8B is a view illustrating a step of forming at least one horizontal part of the EM-tunnel and a step of forming a groove into which the EM-tunnel connecting block is inserted, and FIG. 8C is a view illustrating a step of inserting the EM-tunnel connecting block.

Referring to FIG. 8A, it is difficult to manufacture an EM-tunnel having a curved connecting part which connects at least one horizontal part and at least one vertical part by using a process of forming a vertical via hole. Accordingly, a system for manufacturing a PCB according to another embodiment of the inventive concept (hereinafter, referred to as the system) may prepare an EM-tunnel connecting block 810 including at least one vertical part and a connecting part (a connecting part which connects at least one horizontal part and at least one vertical part) of the EM-tunnel in advance to manufacture a PCB by using the EM-tunnel connecting block 810. Here, the EM-tunnel connecting block 810 may be manufactured through a method of cutting and bending an existing flexible E-tube and fixing the E-tube with a block material.

In detail, referring to FIG. 8B, first, the system laminates a horizontal metal thin film and a horizontal dielectric material on the PCB 820 such that the EM-tunnel including a dielectric core and a metal clad which surrounds the dielectric core is embedded in the PCB 820 to form at least one horizontal part 821 of the EM-tunnel. For example, the system may form the at least one horizontal part 821 of the EM-tunnel based on the process described with reference to FIGS. 7A to 7C. Further, the system may manufacture the PCB 820 in which the at least one horizontal part 821 of the EM-tunnel is embedded, by burying the E-tube in the PCB.

Subsequently, the system forms a groove 822 into which the EM-tunnel connecting block 810 (see FIG. 8C) is inserted on the PCB 820. Although it is in the drawings that two EM-tunnel connecting blocks 810 are provided and two grooves 822 are formed, the inventive concept is neither limited nor restricted but only one groove 822 may be formed.

Thereafter, referring to FIG. 8C, the system inserts the EM-tunnel connecting block 810 into the groove 822 (from FIG. 8B) formed in the PCB 820.

Accordingly, the at least one port of the EM-tunnel manufactured through the above-mentioned manufacturing process may be exposed to a surface of the PCB 820.

Figure 9A:
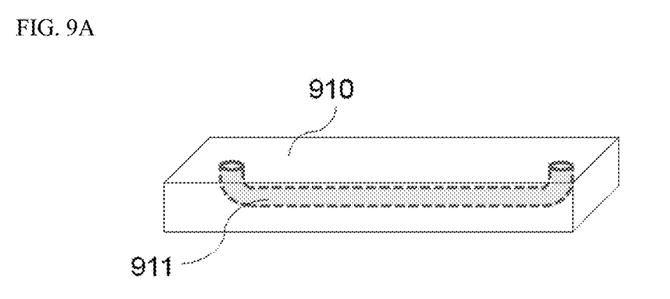
FIGS. 9A to 9C are views illustrating a method for manufacturing a printed-circuit board according to another embodiment of the inventive concept.
Figure 9B:
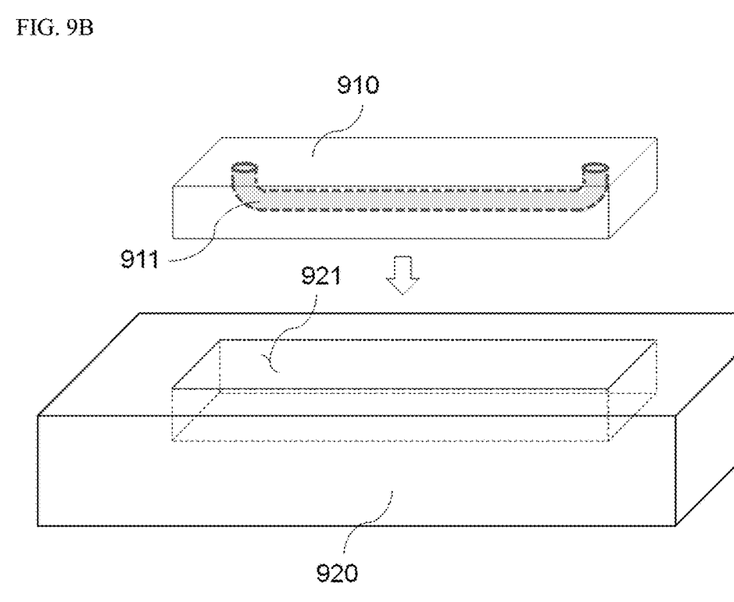
Figure 9C:
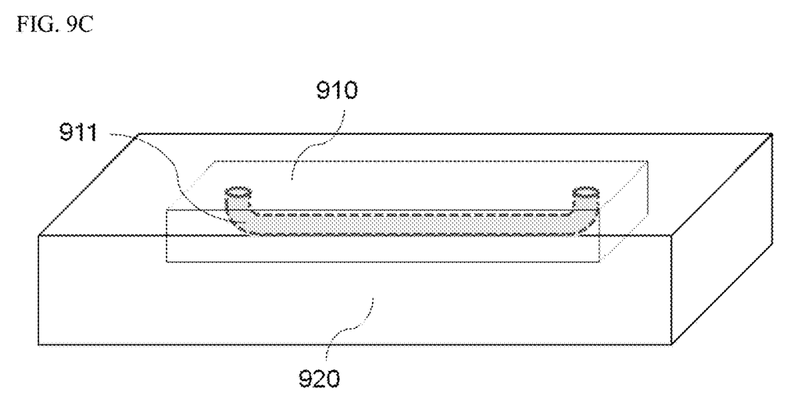

FIGS. 9A to 9C are views illustrating a method for manufacturing a PCB according to another embodiment of the inventive concept. In detail, FIGS. 9A to 9C are views illustrating a method for manufacturing a PCB by using an EM-tunnel unit including both of at least one horizontal part and at least one vertical part (including a connecting part).

FIG. 9A is a view illustrating a step of preparing an EM-tunnel unit, FIG. 9B is a view illustrating a step of forming a groove into which the EM-tunnel unit is inserted, and FIG. 9C is a view illustrating a step of inserting the EM-tunnel unit.

Referring to FIG. 9A, it is difficult to manufacture an EM-tunnel having a curved connecting part which connects at least one horizontal part and at least one vertical part by using a process of forming a vertical via hole. Accordingly, a system for manufacturing a PCB according to another embodiment of the inventive concept (hereinafter, referred to as the system) prepares an EM-tunnel unit 910 including at least one horizontal part and at least one vertical part of an EM-tunnel (also including a connecting part which connects the at least one horizontal part and the at least one vertical part) in advance to shorten the complexity and consumption of the process for manufacturing the PCB.

In detail, the EM-tunnel unit 910 may be manufactured in advance based on the process illustrated in FIG. 7A to 7D or the process illustrated in FIGS. 8A to 8C. Further, the EM-tunnel unit 910 may be manufactured through a method by using an existing flexible E-tube. For example, the E-tube may be mounted in the material of the unit 910 just as the E-tube is bent to form an EM-tunnel in which at least one horizontal part and at least one vertical part are connected to each other.

Accordingly, referring to FIG. 9B, a groove 921 into which the EM-tunnel unit 910 including at least one horizontal part and at least one vertical part of the EM-tunnel 911 is formed in the PCB 920 such that the EM-tunnel 911 including a dielectric core and a metal clad which surrounds the dielectric core is embedded in the PCB 920.

Thereafter, referring to FIG. 9C, the system inserts the EM-tunnel unit 910 into the location corresponding to the groove 921 from FIG. 9B formed in the PCB 920.

Accordingly, the at least one port of the EM-tunnel 911 manufactured through the above-mentioned manufacturing process may be exposed to a surface of the PCB 920.

In this way, the PCB manufacturing processes illustrated in FIGS. 7A to 7D, FIGS. 8A to 8C, and FIGS. 9A to 9C may be adaptively selected and performed, and when the PCB includes a plurality of EM-tunnels, the plurality of EM-tunnels may be embedded in the PCB through different processes by combining the above-mentioned manufacturing processes.

Although the embodiments of the present disclosure have been described with reference to the limited embodiments and the drawings, the inventive concept may be variously corrected and modified from the above description by those skilled in the art to which the inventive concept pertains. For example, the above-described technologies can achieve a suitable result even though they are performed in different sequences from those of the above-mentioned method and/or coupled or combined in different forms from the method in which the constituent elements such as the system, the architecture, the device, or the circuit are described, or replaced or substituted by other constituent elements or equivalents.

Therefore, the other implementations, other embodiments, and the equivalents of the claims pertain to the scope of the claims.

The inventive concept can provide an EM-tunnel-embedded printed-circuit structure which transmits a signal in the form of an electromagnetic wave by replacing a micro-strip signal line which transmits an electrical signal in the form of a voltage or a current in an existing densely-integrated PCB, a method for manufacturing the same, and a method of transmitting a signal.

In detail, the inventive concept can provide an EM-tunnel-embedded PCB structure including at least one horizontal part and at least one vertical part based on a dielectric core and a metal clad which surrounds the dielectric core, a method for manufacturing the same, and a method of transmitting a signal.

In particular, the inventive concept can provide an EM-tunnel-embedded PCB structure in which an electromagnetic signal of a specific frequency band by which absorption of the electromagnetic signal by the metal clad is low enough, a method for manufacturing the same, and a method of transmitting a signal.

Accordingly, unlike the architecture of a densely-integrated PCB according to the related art, the inventive concept can prevent an interference between neighboring transmission lines and minimize distortion and loss of signals in bonding or soldering parts between a chip and a PCB by transmitting an electromagnetic signal through an isolated EM-tunnel, and can solve an impedance mismatching problem of an electromagnetic signal by forming a dielectric core in the inner space of an EM-tunnel.

Further, the inventive concept can simplify a bonding or soldering process of a chip mounted on a PCB by exposing at least one port of the EM-tunnel to a surface of the PCB.

In addition, unlike a structure of transmitting an electromagnetic signal between chips by using an E-tube according to the related art, the inventive concept can solve a disadvantage in which the E-tubes are complexly entangled and occupy a large space even when a PCB is connected to another PCB, by minimizing exposure of transmission lines which transmit electromagnetic signals.

Furthermore, the inventive concept can provide an EM-tunnel-embedded PCB structure which is compatible with a structure of transmitting electromagnetic signals between chips by using an existing E-tube, a method for manufacturing the same, and a method of transmitting a signal.

Then, the inventive concept can provide a PCB structure which include a connector that allows EM-tunnels embedded in different PCBs and E-tubes to be compatible with each other when the PCBs are connected to each other through an E-tube a method for manufacturing the same, and a method of transmitting a signal.

In addition, the inventive concept can provide a PCB structure which transmits an electromagnetic signal through a free space between PCBs, instead of transmitting an electromagnetic signal from one PCB to another PCB through an E-tube, a method for manufacturing the same, and a method of transmitting a signal.

Then, the inventive concept can provide a PCB including a connector which allows a PCB to efficiently transmit an electromagnetic signal to another printed-circuit board through a free space between the PCBs, a method for manufacturing the same, and a method of transmitting a signal.

While the inventive concept has been described with reference to exemplary embodiments, it will be apparent to those skilled in the art that various changes and modifications may be made without departing from the principle and scope of the inventive concept. Therefore, it should be understood that the above embodiments are not limiting, but illustrative.

What is claimed is:

1. A printed-circuit board (PCB) structure having an electromagnetic (EM)-tunnel-embedded architecture, the PCB structure comprising:
   a first PCB; and
   a first EM-tunnel-embedded in the first PCB,
      wherein the first EM-tunnel comprises a dielectric core and a metal clad which surrounds the dielectric core and has at least one port exposed to a first surface of the first PCB, and
      wherein the first EM-tunnel further comprises another port exposed to the first surface or a second surface of the first PCB, wherein said another port is disposed to face at least one port of a second EM-tunnel embedded in a second PCB separated from the first PCB to transmit an electromagnetic signal to the second EM-tunnel through a free space between the first PCB and the second PCB,
      wherein connectors are disposed in said another port of the first EM-tunnel and the at least one port of the second EM-tunnel, respectively, and wherein the cross-section of an aperture on one side of each of the connectors has a shape which coincides with the cross-sectional shape of the first EM-tunnel or the second EM-tunnel, and the cross-section of an aperture on another side of each of the connectors has a funnel shape for transmitting and receiving the electromagnetic signal through the free space.

2. The PCB structure of claim 1, wherein the first EM-tunnel transmits an electromagnetic signal of a frequency band by which absorption of the electromagnetic signal by the metal clad is low.

3. The PCB structure of claim 1, wherein the first EM-tunnel comprises at least one horizontal part and at least one vertical part, and a connecting part which connects the at least one horizontal part and the at least one vertical part has at least one of a vertical form, an oblique form, or a curved form.

4. The PCB structure of claim 1, wherein the at least one port of the first EM-tunnel is aligned with a micro-strip-to-waveguide transition to admit an electromagnetic signal emitted from the micro-strip-to-waveguide transition (MWT) into the first EM-tunnel.

5. A method of manufacturing a PCB structure having an EM-tunnel-embedded architecture, the method comprising:

laminating a horizontal metal thin film and a horizontal dielectric material on a first PCB such that a first EM-tunnel comprising a dielectric core and a metal clad which surrounds the dielectric core is embedded in the first PCB to form at least one horizontal part of the first EM-tunnel; and forming a via hole in the first PCB and laminating a vertical metal thin film and a vertical dielectric material to form at least one vertical part of the first EM-tunnel,
wherein the first EM-tunnel comprises at least one port exposed to a first surface of the PCB, and another port exposed to the first surface or a second surface of the first PCB, wherein said another port is disposed to face at least one port of a second EM-tunnel embedded in a second PCB separated from the first PCB to transmit an electromagnetic signal to the second EM-tunnel through a free space between the first PCB and the second PCB.

\* \* \* \* \*